United States Patent [19]
Du et al.

[11] Patent Number: 5,887,096
[45] Date of Patent: Mar. 23, 1999

[54] ARRANGEMENT FOR GUIDING AND SHAPING BEAMS FROM A RECTILINEAR LASER DIODE ARRAY

[75] Inventors: Keming Du, Aachen; Peter Loosen, Kornelimünster, both of Germany

[73] Assignee: Frannhofer Gesellschaft Zur Forderung der Angewandten Forschung, Offenbach am Main, Germany

[21] Appl. No.: 817,845
[22] PCT Filed: Oct. 26, 1995
[86] PCT No.: PCT/EP95/04215
  § 371 Date: May 27, 1997
  § 102(e) Date: May 27, 1997
[87] PCT Pub. No.: WO96/13884
  PCT Pub. Date: May 6, 1996

[30]      Foreign Application Priority Data

Oct. 27, 1994  [DE]   Germany ................... 44 38 368.1

[51] Int. Cl.⁶ ...................................... G02B 6/26
[52] U.S. Cl. .................. 385/39; 385/47; 385/42
[58] Field of Search ................ 385/39, 43, 42, 385/41–48, 33, 34

[56]             References Cited

U.S. PATENT DOCUMENTS

| | | |
|---|---|---|
| 4,128,308 | 12/1978 | McNaney . |
| 4,725,131 | 2/1988 | Goodwin et al. . |
| 4,763,975 | 8/1988 | Scifres et al. . |
| 4,921,338 | 5/1990 | Macken et al. . |
| 4,986,634 | 1/1991 | Horikawa et al. ...................... 350/174 |
| 5,268,978 | 12/1993 | Po et al. . |
| 5,568,318 | 10/1996 | Leger et al. ........................ 385/33 X |
| 5,668,903 | 9/1997 | Neuberger et al. ...................... 385/38 |
| 5,734,766 | 3/1998 | Flint ........................................ 385/43 |

FOREIGN PATENT DOCUMENTS

| | | |
|---|---|---|
| 0569181 | 11/1993 | European Pat. Off. . |
| WO 95/15510 | 6/1995 | WIPO . |

OTHER PUBLICATIONS

Proceedings on the Conference on Lasers and Electro–Optics Europe (Cleo/Europe), Amsterdam Aug. 28–Sep. 2, 1994, Inst. of Electronics pp. 410–411, Diode Laser Bar Beam Shaping Technique, Clarkson, W.A. et al.

Proceedings on the Conference on Lasers and Electro–Optics Europe (Cleo/Europe), Amsterdam Aug. 28–Sep. 2, 1994, Inst. of Electronics, Stripe stacker for use with laser diode bars, Edwin, pp. 222–224.

*Primary Examiner*—Phan T.H. Palmer
*Attorney, Agent, or Firm*—Fulbright & Jaworski LLP

[57]             ABSTRACT

An arrangement in which a reflection lens system shapes and guides beams from a rectilinear laser diode array with beam outlet surfaces lying in a common plane is disclosed In order to map the beams from the individual laser diodes to form a substantially uniform radiation field or pattern using such an arrangement, at least one first reflection component having a reflection surface is associated with each beam in order to bring together the individual outlet beams. The reflection surfaces are disposed in mutually offset planes, the offset corresponding sequentially to the sequence of the laser diodes in the array.

52 Claims, 12 Drawing Sheets

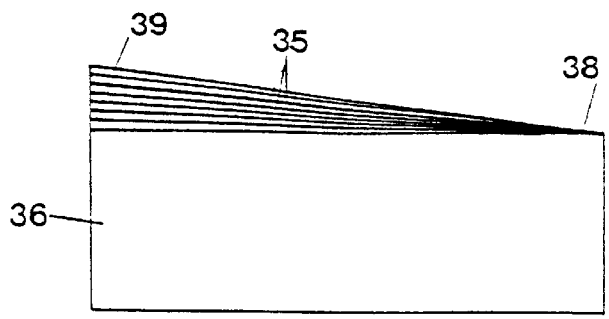
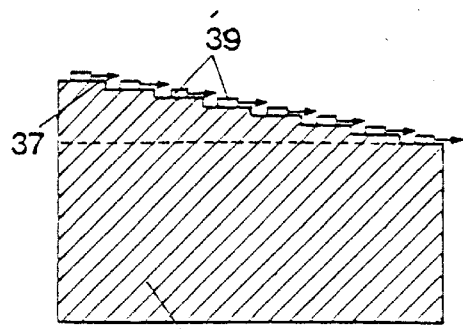
FIG. 17  FIG. 16
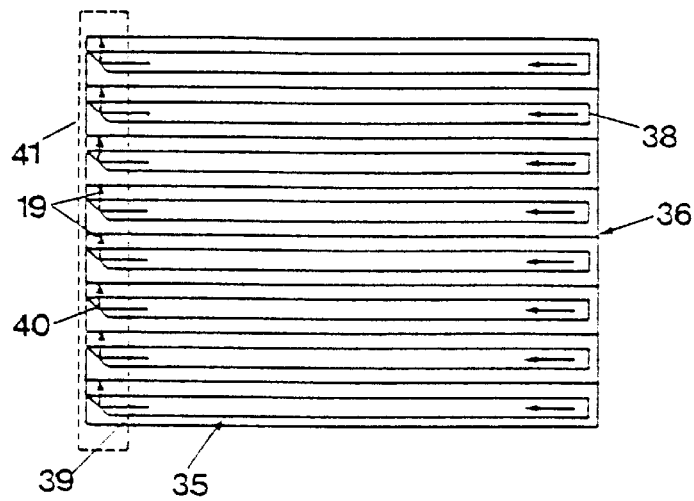
FIG. 15
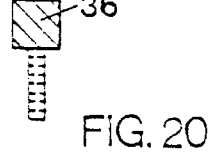
FIG. 20
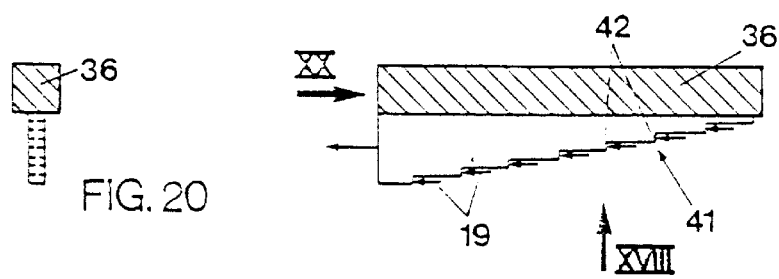
FIG. 19
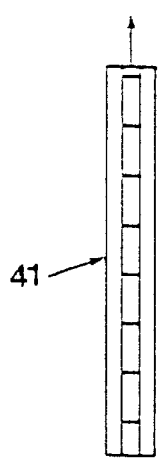
FIG. 18
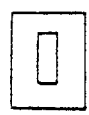
FIG. 21

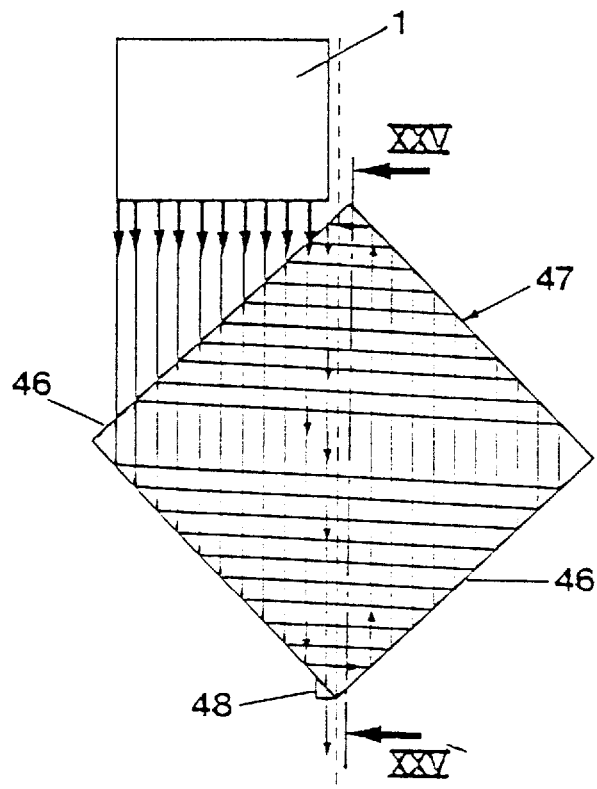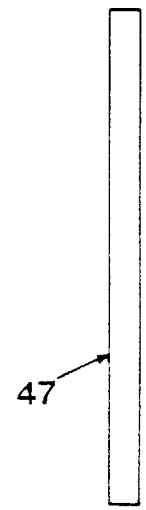
FIG. 24            FIG. 25
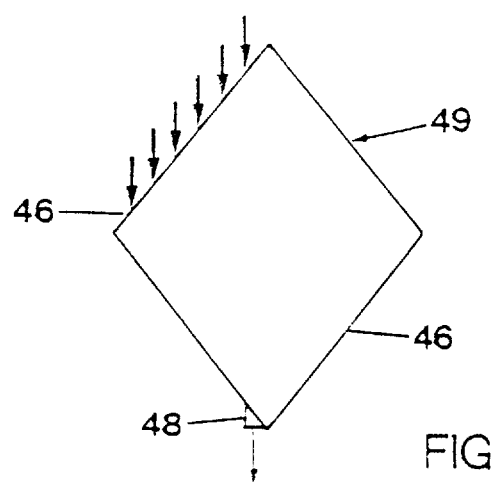
FIG. 26

ARRANGEMENT FOR GUIDING AND SHAPING BEAMS FROM A RECTILINEAR LASER DIODE ARRAY

FIELD OF THE INVENTION

The present invention pertains to an arrangement for forming and guiding beams from a rectilinear laser diode array with beam exit surfaces on a common plane, the beams being guided and shaped by means of a system of reflecting optical components.

BACKGROUND OF THE INVENTION

As a result of the rapid progress in the development of high-power diode laser technology in recent years, many new applications for diode lasers have been found. These include, for example, the pumping of solid-state lasers by means of laser diodes.

A special feature of diode lasers is the asymmetric cross section of the exiting beam, which emerges from the emitting zone or exit surface. This beam has a characteristic elliptical form in cross section. The major axis of this elliptical cross section is perpendicular to the pn transition region of the diode structure (also called the "fast direction"), whereas the minor axis is parallel to the plane of the pn transition region (also called the "slow direction"). In addition to this asymmetric beam cross section, it is also true that the emerging radiation shows considerable divergence in the direction of the major axis, that is, in the direction perpendicular to the plane of the pn transition region or the active layer. The beam angle can be as much as 90°, whereas this divergence is only about 10° in the direction of the minor axis.

Because of the special elliptical cross section of the beam, the wide divergence perpendicular to the active plane (also called the "junction plane"), and the relatively small divergence perpendicular to that, the use of diode lasers of this type depends significantly on how well the diode laser radiation can be guided and shaped, especially when many of these laser diodes are combined into laser diode fields or arrays.

The conventional method for guiding and forming the laser diode radiation involves the use of systems of transmitting optical components such as lenses and prisms, which are inserted into the beam path of the radiation emerging from the exit opening of the laser diode. In certain applications, such as in the case of the diode pumping of solid-state lasers, the diode radiation of each diode must be focussed by means of a lens on the solid rod. The problem here is finding a lens with an extremely high numerical aperture, by means of which all of the diode radiation with the above-described divergence angle of approximately 90° in the direction perpendicular to the plane of the pn junction can be collected. In principle, such lenses can be made only of glass with a very high index of refraction. A disadvantage, however, is that the large angle of incidence causes a large amount of energy to be lost by reflection in the lens; this loss is typically more than 20%, which therefore decreases the high efficiency which, among other things, characterizes a diode laser.

High-power laser diodes typically have active media with a cross section of 1×100 μm. For cost reasons, furthermore, several laser diodes are arranged with their beam exit surfaces in a row or in complex fields or arrays. So that laser diodes can produce a radiation field in cases where they are lined up in a row, the diodes are set up so that the major axes of the elliptical cross sections of the beams are all parallel to each other. Because the beam quality is diffraction-limited in the narrow direction and diffraction-limited by a factor of approximately 1,000 in the junction plane, the radiation emitted by a laser diode array cannot be focussed by cylindrical lenses and spherical lenses or by combinations thereof into a small, circular spot. This restricts the use of laser diode arrays in applications such as guiding the beam into an optical fiber or the so-called "end-on-pumping" of solid-state lasers.

On the basis of the problems discussed above, the task of the present invention is to provide an arrangement which can be used for laser diodes lined up in a row and on a common plane and by means of which the beams of the individual laser diodes can be mapped to an essentially uniform beam field or beam field pattern.

SUMMARY OF THE INVENTION

This task is accomplished in an arrangement for shaping and guiding beams from a rectilinear laser diode array with beam exit surfaces situated on a common plane by means of a system of reflecting optical components, characterized in that, to gather the individual exit beams, a first reflecting element with a reflecting surface is assigned to each beam, and in that the reflecting surfaces are arranged on planes which are offset with respect to each other, the sequence of these offsets corresponding to the sequence of laser diodes in the array. With an arrangement such as this in its simplest embodiment, a minimum number of optical components with a high power transfer coefficient can map the beams in the form of the desired beam field onto an image plane. By means of these simple reflecting surfaces, the cross sections of the beams produced by a laser diode array of this type can be brought so closely together by means of an appropriate inclination of the reflecting surfaces with respect to the incident beam that the individual radiation fields emerging from the exit windows of the laser diodes are laid down snugly against each other. In a further embodiment of the arrangement, each of the individual reflecting surfaces is a different distance from the beam exit surface of the laser diode of the array assigned to it, the sequence of different distances corresponding to the sequence of laser diodes of the array. The distances between the reflecting surfaces and the array and the offsets of the reflecting surfaces with respect to each other are preferably also selected in correspondence with the choice of the distance between the individual beam exit surfaces of the laser diodes of the array from each other and adjusted appropriately to the requirements. Preferably, however, the centers of the irradiated surface areas of the individual reflecting surfaces, onto which the beams of the individual laser diodes fall, are situated in a straight line; that is, each reflecting surface is offset with respect to the next by the same amount, and the distances between the reflecting surfaces and the beam exit surfaces of the laser diodes also change by the same amount in each case, for each successive laser diode of the linear array.

So that the beams can be gathered into a closed beam field by means of a simple optical system, it has been found advantageous for at least one second, additional reflecting surface to be assigned to each first reflecting surface and placed in the beam path of each beam emerging from a laser diode. These second reflecting surfaces are arranged again in planes which are offset with respect to each other and which are separated by different distances from the first reflecting surfaces to which they are assigned, where the sequence of the offsets and of the changes in the distances of the reflecting surfaces again correspond to the sequence of the first reflecting surfaces. Depending on the requirement on the field to be irradiated in the image plane of the laser diode array, additional reflecting surfaces can follow each second reflecting surface in the beam direction; the maximum number of successive reflecting surfaces by which a beam is reflected is preferably four.

A mirror configured in the form of a staircase has been found advantageous as a simple optical element which can constitute and form the individual reflecting surfaces. A staircase-like mirror of this type consists of an appropriate substrate carrier, which has been coated with a mirror surface by means of, for example, vapor deposition. It is also possible, however, to grind a staircase mirror into a glass substrate by means of diamond tools; a staircase mirror of this type offers the advantage that it is extremely stable and distortion-free. The arrangement according to the invention offers the advantage that the first, second, and any additional reflecting surfaces can be formed by flat mirror elements, which are therefore extremely easy to produce. Because of this simple structure, it is then also possible for the beams which emerge from laser diode arrays consisting of several rows of laser diodes to be mapped onto a single image plane as a continuous radiation field, one or more reflecting arrangements in the beam path being assigned to each straight row of laser diodes of the array, as described above.

Another preferred design for mapping the beams emerging from the laser diodes of the array onto a plane under consideration of the above-described principle so that, for example, a closed radiation field is produced is obtained by assigning a rod-like or ribbon-like waveguide with a wedge angle opening in the beam direction to the beam of each laser diode. The beam enters one end of the rod or ribbon, whereas, at the opposite end, the first reflecting surface assigned to the beam is designed in such a way that the beam emerges sideways. The waveguide preferably has two flat boundary surfaces, which form an angle with each other from the beam entry side to the beam exit side and which are perpendicular to a common plane; the angle here is in the range of 5°–15°, and the length of this waveguide is in the range of 2–10 mm. By means of a strip-like or ribbon-like wave guide, the radiation emerging from each laser diode can be guided in a defined manner to the first reflecting surface and also compressed on its way there. A waveguide of this type is arranged in such a way with respect to the beam or to the exit window of the laser diode that the two surfaces of the waveguide forming an angle with each other are perpendicular to the major axis of the elliptical cross section of the beam. In addition, a wedge-angle waveguide of this kind offers the advantage that no optical imaging components are required, and the possibility exists of constructing the waveguide(s) and the laser diodes in an integrated manner on a common substrate, preferably silicon.

The exit surface of each waveguide can be beveled with respect to the direction in which the beam propagates in the waveguide and silvered (that is, designed as a reflecting surface), so that the associated beam emerges at a defined angle and is mapped onto an image plane at a defined offset with respect to the incoming beams. On this image plane, situated beyond the exit ends of the waveguides, additional reflecting surfaces, that is, preferably one additional, second reflecting surface, can again follow after each beam to guide or gather the radiation in a certain direction in such a way that a closed radiation field is produced from the individual beam cross sections.

In another alternative design according to the invention, a common, plate-like waveguide with a wedge angle opening in the direction of beam travel is assigned to the beams of the laser diodes; the beams enter one end of the plate and emerge at its opposite end, where the distance of this beam exit end increases continuously from the first laser diode to the last laser diode or from the two outermost diodes to a center diode; a glass rod with a rectangular cross section is placed directly on the end through which the beams exit; the surface of this glass rod opposite and thus a certain distance away from the beam exit end is made reflective; and, after total reflection, the beams emerge through a beam exit window in an area of the glass rod which they finally reach by reflection which is as far away as possible from the laser diodes. With an arrangement such as this, the advantage is obtained that the individual beams of the individual laser diodes are guided together along the glass rod to a common beam exit window, which can be formed by, for example, a prism cemented to the slanted surface of the glass rod, without the need for any additional optical elements. As already discussed with respect to the waveguides, the boundary surfaces of the waveguide form an angle with each other, which is in the range of 5°–15°, while the length of the waveguide is in the range of 5–20 mm. There is again the possible in this design of providing second reflecting surfaces in the beam path of each laser diode, which are combined to form a second mirror in the form of a staircase. This, however, is based on the assumption that the plate-like waveguide is configured in such a way that, on the side of the waveguide opposite the beam entry side, each of the beams emerges individually, and also on the assumption that a separate exit window, possibly in the form of a prism, is assigned to each beam, the individual beam from this exit surface thus falling onto the second reflecting surfaces of the staircase-like second mirror assigned to it.

In another embodiment of the invention, a common plate-like waveguide with four lateral surfaces is assigned to the beams of each laser diode. The lateral surfaces form two pairs, and the lateral surfaces of each pair are parallel to each other. The beams which emerge from the laser diode array enter at offset points into one lateral surface of this plate-like waveguide and are subjected to defined total reflections inside the plate-like waveguide, with the result that the beams of the individual laser diodes are gathered together in the plate-shaped waveguide and emerge through a common beam exit window, which again can be formed by a prism cemented to one end. It is preferable for two adjacent lateral surfaces to form an angle of 90°; that is, the plate-like waveguide has a square or rectangular shape.

Depending on the type of optical system which forms the first reflecting surfaces, an optical imaging system for guiding the beam can be inserted between the beam exit windows of the individual laser diodes and the first reflecting surfaces, such as the staircase mirror. This imaging system can be in the form of a strip-like or ribbon-like waveguide with a wedge angle opening in the beam direction, the beam entering one end of the waveguide and exiting from the opposite end, adjacent to the first reflecting surface.

In another arrangement according to the invention, first a strip-like or ribbon-like waveguide with a wedge angle opening in the beam direction is assigned to the beam of each laser diode, as already described several times above. The individual waveguides come closer and closer together until they finally join to form a common, plate-like waveguide and emerge from the surface opposite the entry side of the waveguide. The waveguide is again provided with a wedge angle opening in the beam direction.

The above-described individual reflecting surfaces for guiding the beams from a rectilinear laser diode array with beam exit surfaces lying on a common plane are preferably oriented with respect to each other in such a way that, after the first reflecting surface, the individual beams from the diodes are offset with respect to each other in a staircase-like manner on an image plane, and so that, after the second reflecting surface, the beams are situated over and under each other on an image plane in such a way that they form a continuous radiation field.

Additional details and features of the present invention can be derived from the following description of an exemplary embodiment on the basis of the drawings.

BRIEF DESCRIPTION OF THE DRAWINGS

FIGS. 15–21 show a fourth embodiment of the invention, similar to the third embodiment as shown in FIGS. 11–14, except that the arrangement of the fourth embodiment for guiding and shaping the radiation is made up of two waveguide arrangements;

FIG. 24 shows a sixth embodiment of the invention of an optical arrangement for shaping and guiding diode laser radiation, which is based on the use of a right-angled prismatic disk;

FIG. 25 shows a cross section along line XXV—XXV of FIG. 24;

FIG. 26 shows a top view of a design for a prismatic disk which can be used as an alternative to the embodiment of FIGS. 22–23;

DETAILED DESCRIPTION

Figure 4:
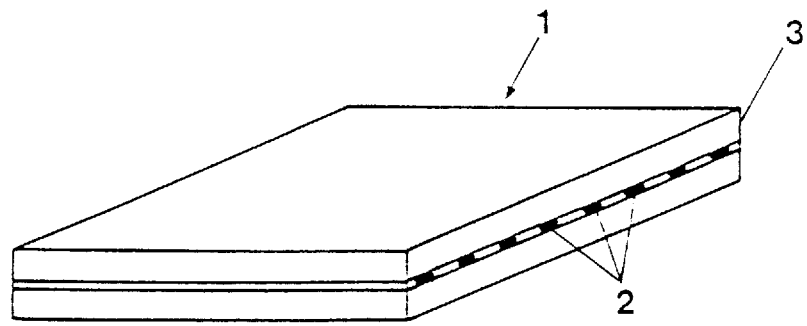
FIG. 4 shows a laser diode array with several laser diodes.
Figure 5:
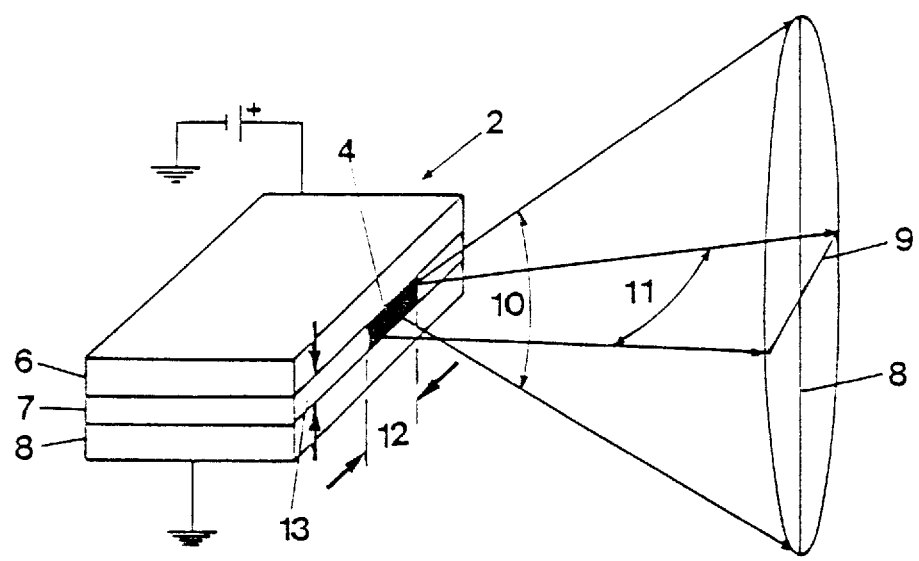
FIG. 5 shows a schematic diagram of a laser diode of the array of FIG. 4 with the typical beam emerging as a cone from the beam exit surface.

The invention pertains to the shaping and guiding of the beams from a rectilinear laser diode array 1, in which a plurality of emitting laser diodes 2, a total of eight such laser diodes 2 being shown in the example in FIG. 4, lie on a straight line and in a common plane 3, with beam exit surfaces 4. The structure of a typical laser diode 2 is shown in FIG. 5. The arrangement has a highly doped $p^+$ phase 5, a p phase 6, and an n phase 7. Beam exit surface 4 of an emitting zone of the active medium extends a certain distance in the direction of the plane of the junction between p phase 5 and n phase 7, whereas it is relatively narrow perpendicular to these planes. Because of the geometry of the active medium, the typical beam cone indicated in FIG. 5 emerges from beam exit surface 4; this beam cone has an elliptical cross section, where major axis 8 is perpendicular to the plane of the pn junction, whereas minor axis 9 of the elliptical cross section is parallel to the plane of the pn junction. Typically, the major dimension of the beam cone perpendicular to the plane of the pn junction, which is also called the "fast" direction, suffers from a divergence angle 10 of approximately 90°, whereas the beam cone in the direction of minor axis 9, that is, perpendicular to the fast direction, also called the "slow" direction, has a divergence angle 11 of only about 10°. A typical dimension of the active medium or of the corresponding beam exit surface 4 is 100 μm in longitudinal direction 12, that is, in the direction of minor axis 9 of the beam cross section, whereas the dimension in the transverse direction 13, that is, in the direction of major axis 8 of the beam cross section is approximately 1 μm. In typical laser diode arrays, up to 24 laser diodes are integrated into an array 1, as illustrated in FIG. 4, with a length of one centimeter.

Figure 1:
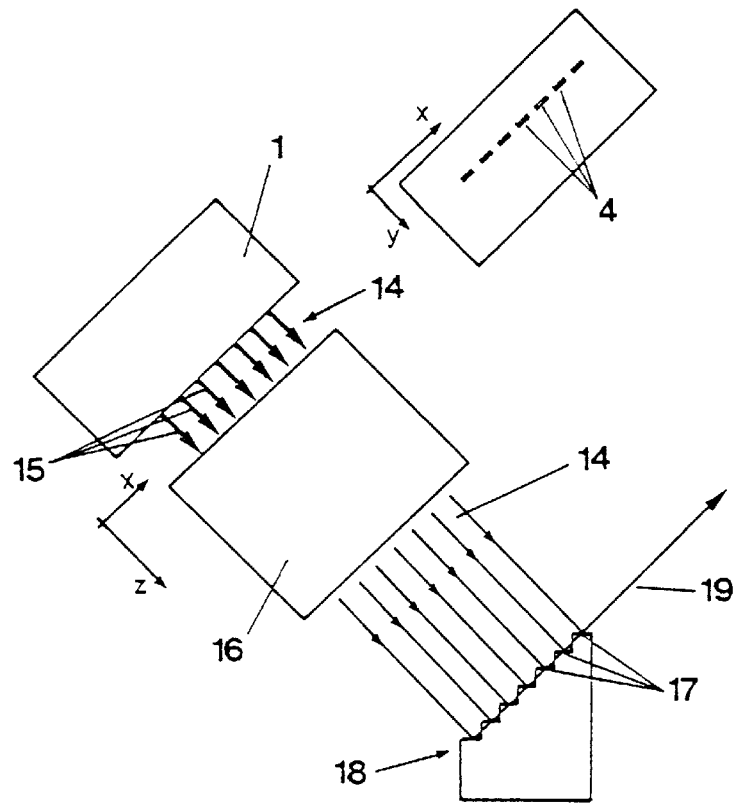
FIG. 1 shows a schematic diagram of a first embodiment of the arrangement according to the invention for shaping and guiding the beams from a rectilinear laser diode array by means of a staircase mirror.
Figure 2:
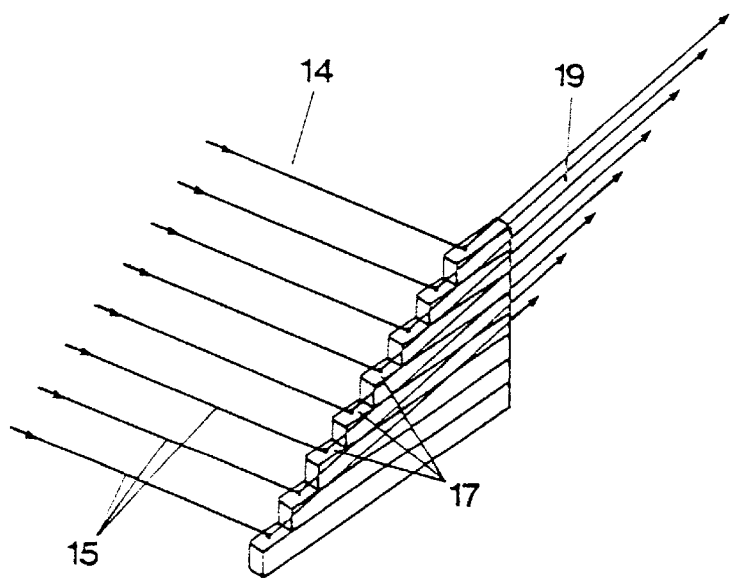
FIG. 2 shows the staircase mirror of FIG. 1 in a schematic, perspective view together with the course of the incident radiation.
Figure 3:
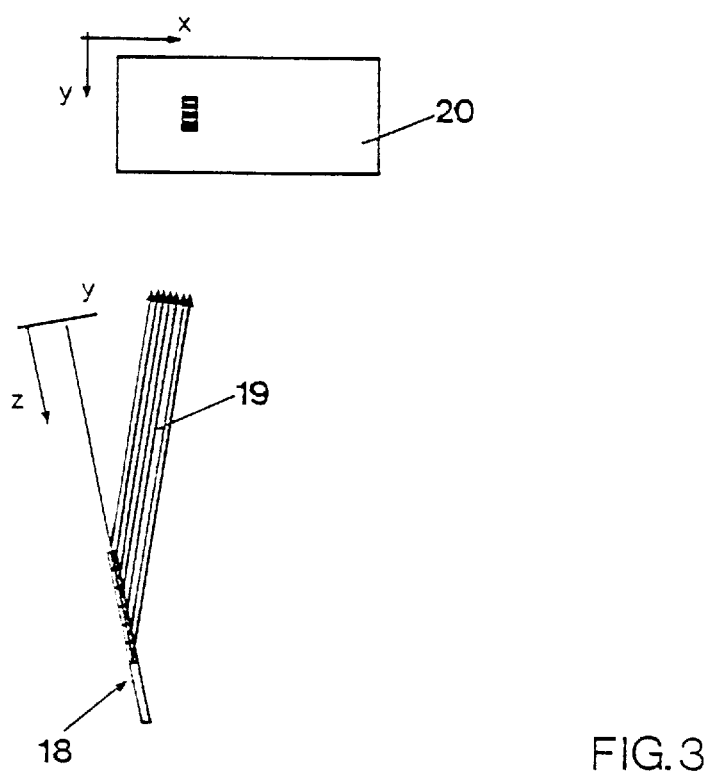
FIG. 3 shows the course of the beam of the arrangement according to FIGS. 1 and 2 in a plane which has been rotated in comparison with that of FIG. 1.

In a first embodiment of the invention, which is shown in FIGS. 1–3, radiation 14 emerging from a laser diode array 1, that is, the individual beam cones 15 of the individual laser diodes 2, is mapped by way of a system of optical imaging elements 16, shown only schematically in FIG. 1, onto individual first reflecting surfaces 17 of a staircase mirror 18. The individual beams 15 are reflected from the individual first reflecting surfaces 17 of staircase mirror 18, and an image of the reflected beams is formed on an image plane 20. It is advantageous for the angle of incidence in the xz plane on first reflecting surfaces 17 and the height of the steps, that is, the lateral offset of the individual reflecting surfaces 17, as well as possibly the distance between reflecting surfaces 17 and beam exit surfaces 4, which are indicated as lying in the xy plane in FIG. 1, to be coordinated with respect to each other in such a way that, in the xz plane, the radiation of all laser diodes 2 of laser diode array 1 are combined into a single beam. In the plane perpendicular to that (the yz plane), the angle of incidence and the orientation of staircase mirror 18 are adjusted with respect to each other in such a way that beams 19, reflected by the approximately horizontal mirror segments, are not reflected back by the adjacent, vertical segments of staircase mirror 18. This adjustment leads simultaneously to the relative offset of the component beams in the yz plane, so that the component beams of the individual laser diodes 2 are arranged next to each other in the narrow direction (y direction). The beam quality along the y axis is reduced by a factor equivalent to the number of laser diodes; simultaneously, the beam quality is increased by the same factor in the plane of the junction (x direction). As a result, the beam qualities in the two directions are comparable, and all of the radiation of laser diode array 1 can be focussed onto a circular spot. FIG. 3 shows a view of the xy plane and the exit beam pattern on exit plane 20. The optical system provided downstream can create an image of these exit beams in the form of a nearly circular spot.

Figure 6:
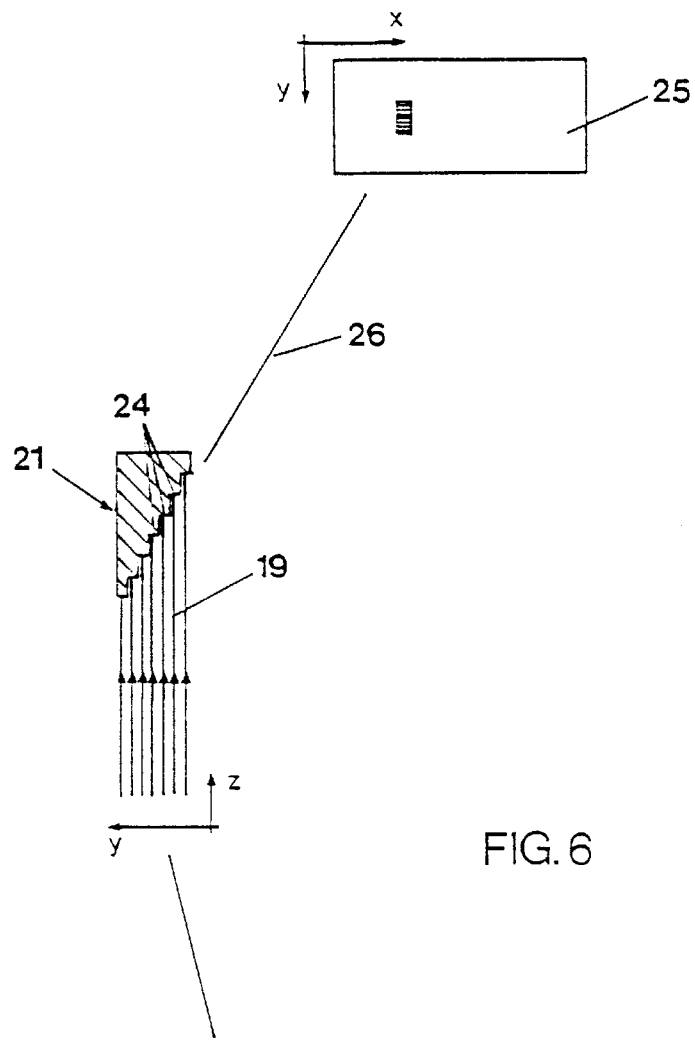
FIGS. 6 and 7 show schematic diagrams of an alternative, second embodiment of the invention, which makes use of two staircase mirrors.
Figure 7:
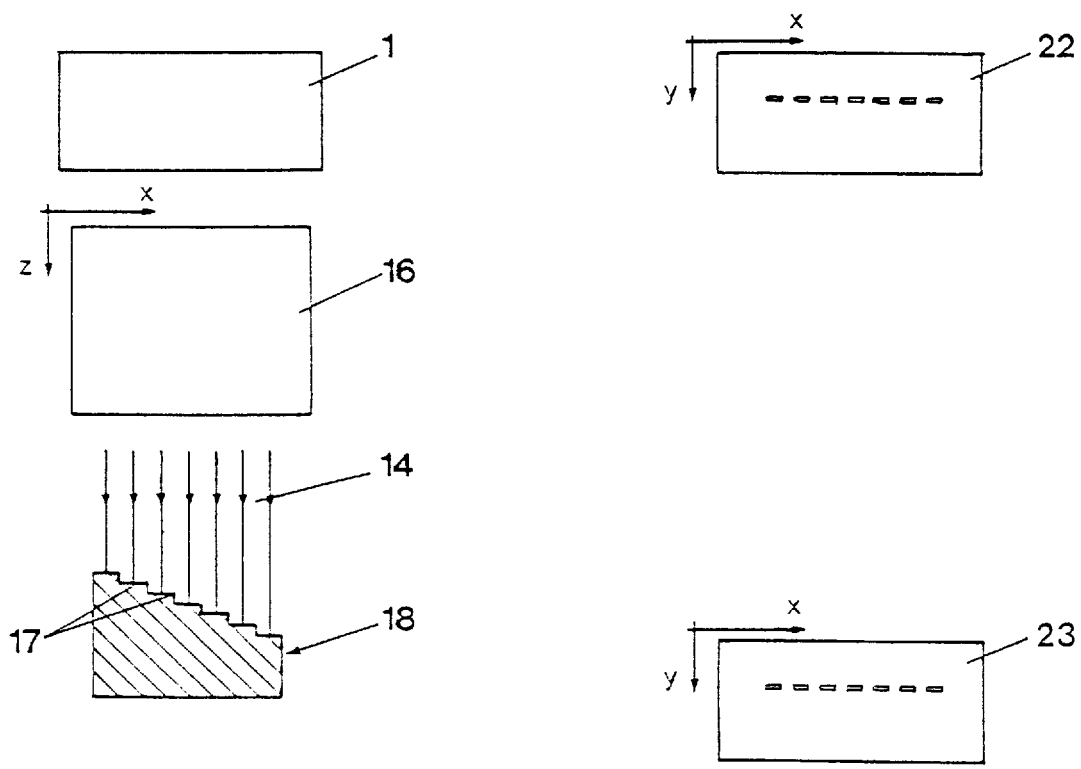

Whereas, in the first embodiment, as shown in FIGS. 1–3, the radiation is collected by way of individual staircase mirrors 18 and formed into a closed radiation field on the image plane, FIGS. 6 and 7 show a second embodiment, according to which a second staircase mirror 21 is used in the beam path in addition to first staircase mirror 18.

At this point it should be pointed out that identical or comparable components appearing in the individual figures of the various embodiments are designated by the same reference numbers.

As the illustration of FIG. 6 shows, radiation 14 from the laser diodes of laser diode array 1 is again mapped onto first reflecting surfaces 17, formed by a first staircase mirror 18, via optical imaging system 16. After being reflected from staircase mirror 18, radiation 19 shows a beam pattern, shown schematically, consisting of beams spaced equal distances apart and offset from each other in a staircase-like manner on image plane 20, extending in the yz plane. For comparison, on the image plane at the upper right, FIG. 7 shows the beam pattern just behind the beam exit surfaces of the laser diodes of laser diode array 1, whereas, on image plane 23 at the lower right, the figure shows the beam pattern of radiation 14 before radiation 14 falls on the individual reflecting surfaces 17 of staircase mirror 18. As the two image planes 22, 23 show, the irradiated fields on image plane 23 extend along a straight line with equal distances between them. After staircase mirror 18, reflected radiation 19 is sent to second staircase mirror 21. The angle of incidence and the height of the steps of first staircase mirror 18 are adjusted in such a way that the offset produced by the reflection is somewhat greater than the dimension of an individual diode beam on the image plane of the preceding optical imaging system in the y direction (fast direction). Second staircase mirror 21, from which radiation 19 or the individual beams are reflected from second reflecting surfaces 24, is, with respect to the angle of incidence and height of the steps, adjusted in such a way that all the component beams are arranged next to each other in the y direction on an image plane (xy plane) behind second staircase mirror 21 and form there a uniform, closed radiation field.

Figure 8:
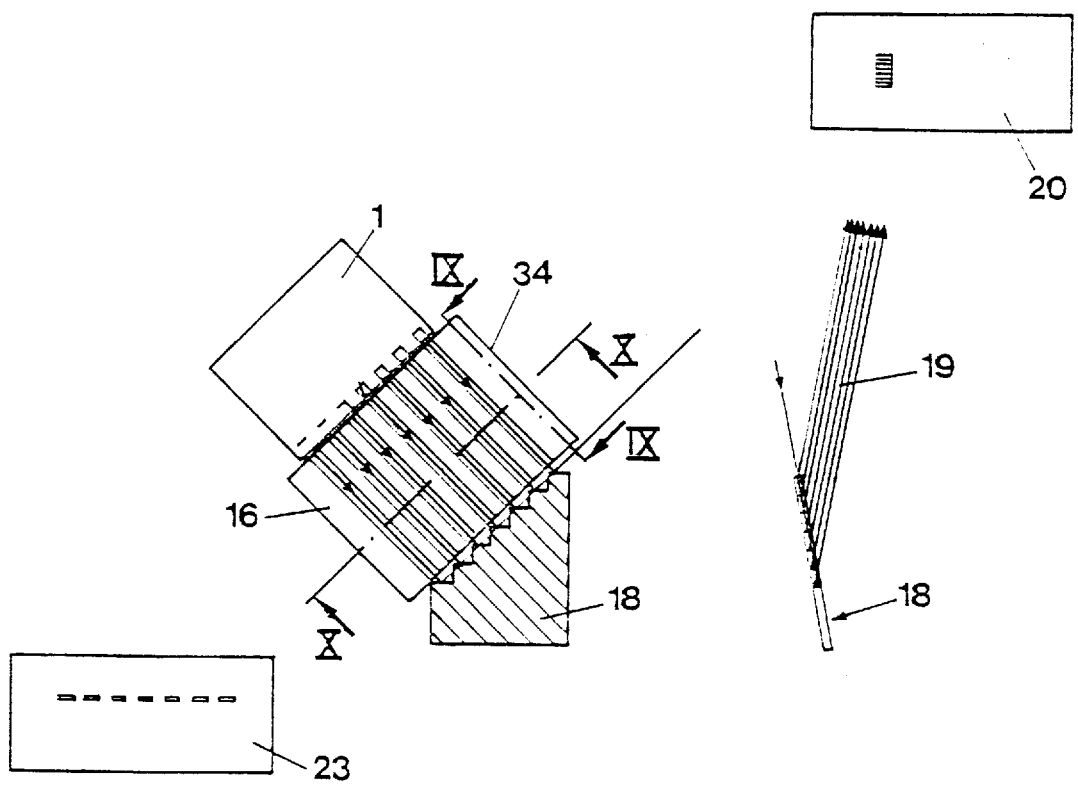
FIG. 8 shows an embodiment similar to that of FIGS. 1–3 but with a special optical imaging system.
Figure 9:
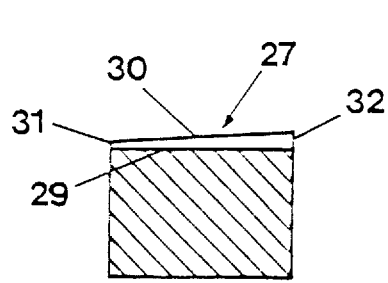
FIG. 9 shows a cross section along line IX—IX of FIG. 8.
Figure 10:
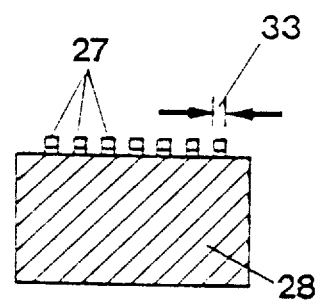
FIG. 10 shows a cross section along line X—X of FIG. 8.
Figure 13:
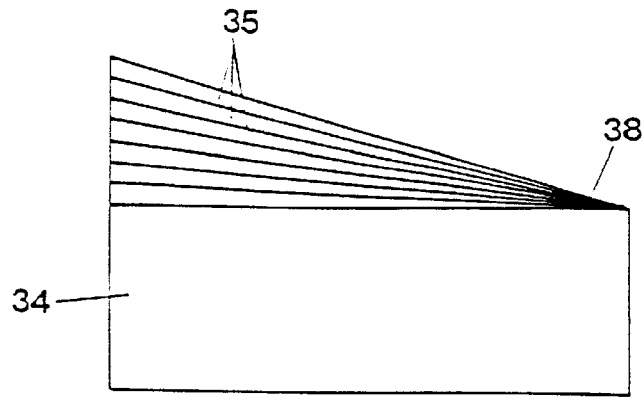
FIGS. 11–13 show various views of a third embodiment of an arrangement for guiding and shaping the beams from a laser diode array by means of individual waveguides.

FIGS. 8–10 show an imaging process corresponding to FIG. 1, except that optical imaging system 16 of FIG. 1 between laser diode array 1 and first staircase mirror 18 takes the form here of strip-like waveguides 27 applied to a support body 28, as an alternative to conventional microoptical and macrooptical systems such as cylindrical and spherical lenses. Each waveguide 27 has a wedge angle in the fast direction of the beam of the laser diode assigned to it, where the wedge angle, that is, the angle between base surface 29, by which waveguide 27 is joined to support body 29, and outside surface 30, is about 10°. The diode radiation enters a waveguide 27 such as this at narrow end surface 31 and emerges from the opposite, large end surface 32. The wedge angle serves to reduce the divergence in the fast direction. The width 33 of each waveguide 27 (FIG. 10) is at least the same as that of an individual laser diode or its beam exit surface 4. At narrow end surface 31, the height of end surface 31 ranges from a few $\mu$m to a few tens of $\mu$m, whereas, at large end surface 32, the height ranges from 10 $\mu$m to approximately 100 $\mu$m. These strip-like waveguides 27 can be applied to support body 28 by means of, for example, a coating process. They can also consist, however, of wedge-shaped glass plates cemented to the support. As an alternative to individual, strip-like waveguides 27, individual waveguides 27, as illustrated in FIGS. 8–10, can be combined into a common ribbon waveguide with a corresponding wedge angle, as indicated by frame 34 in FIG. 8. Image plane 23 again shows the radiation fields on the exit side of waveguide 27, before they fall onto staircase mirror 18, whereas image plane 20 corresponds to image plane 20 of FIG. 3.

Figure 11:
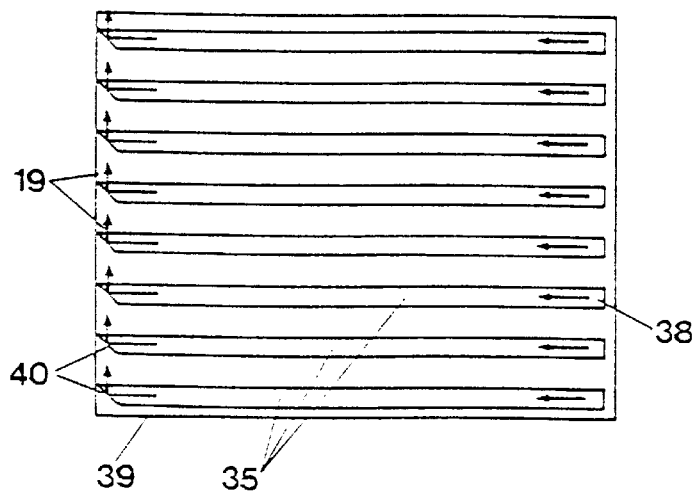
Figure 12:
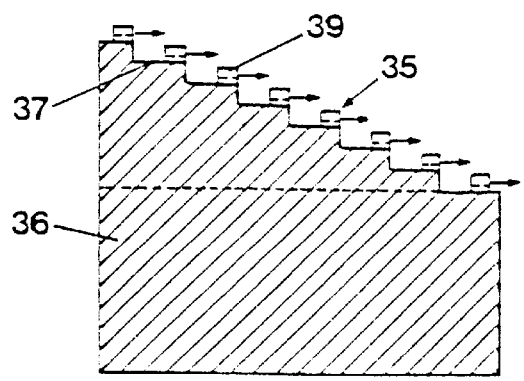
Figure 14:
FIG. 14 shows the radiation pattern on an image plane, obtained by means of the arrangement according to FIGS. 11–13.

FIGS. 11–14 show a third embodiment of the invention for guiding and shaping the radiation from a laser diode array 1; the array itself, however, is not shown in the figures. For this arrangement, individual waveguides 35, to each of which a laser diode 2 is assigned, are applied to a support 36, formed with a staircase-like structure 37. Waveguides 35 are strips, which have a wedge angle proceeding from beam entry side 38 to beam exit side 39. As also can be seen on the basis of FIGS. 12 and 13, staircase structure 37 slants from beam entry side 38 to beam exit side 37; the individual waveguides 35 therefore slant increasingly in a corresponding manner. Beam entry sides 38 are on a straight line, in correspondence with the arrangement of beam exit surfaces 4 of the individual laser diodes, whereas beam exit sides 38 are spaced apart and offset with respect to each other in the way which corresponds to staircase structure 37. As illustrated in FIG. 11, in a view looking down onto the top of support 36 and waveguides 27, the ends of all waveguides 27 on beam exit side 39 are provided with beveled ends 40, which form first reflecting surfaces, by which the beams are reflected by total reflection and thus deflected in the manner shown by reflected beams 19, which thus escape from the lateral surface of each waveguide 27. Because of the stepped structure of support 36 and thus the graduated arrangement of beam exit sides 39 at beveled ends 40, the beams of the various diodes emerge at different heights and thus stack on top of each other, as the image pattern on the image plane illustrated in FIG. 14 shows. The wedge angle of individual waveguides 27 leads to a reduction in the divergence angle of the radiation of the corresponding laser diode in the fast direction.

FIGS. 15–21 show an additional, fourth embodiment of the invention. In contrast to the third embodiment, which was described on the basis of FIGS. 11–14, in this embodiment two wave-guiding parts are used, comprising first waveguides 35 (FIGS. 15–17) and second waveguides 41 (FIGS. 19–20). First waveguides 35 correspond in their basic design to the arrangement of FIGS. 11–13. As a comparison of FIG. 16 with FIG. 12 of the previously described embodiment shows, the heights of the individual steps of staircase structure 37 are made slightly smaller. Waveguides 35 can again be provided with a wedge angle such as that shown in FIG. 17. The diode beams enter at one end, where all waveguides 35 are lined up on a common plane. Ends 40 are beveled, so that again the diode radiation escapes at beveled ends 40 from the lateral surface under total reflection in each case. As shown in FIG. 15 by a broken line 41 and as shown by the side view in FIG. 19, second waveguide 41 is arranged or optically linked above the ends of first waveguides 35 in such a way that the diode beams emerging from first waveguide 35 are able to enter an entry window 42. By means of this second waveguide 41, the beams are gathered together, so that the radiation emerging from second waveguide 41 generates a radiation field on an image plane such as that shown in FIG. 21. As FIG. 18 shows, in a view looking down from above in the direction of viewing arrow XVIII in FIG. 19, and as FIG. 20 shows, looking down from above onto waveguide 41 in the direction of viewing arrow XX of FIG. 19, the individual waveguides are small, flat plates, which can be cemented on top of each other, or they can be made from an appropriately formed, one-piece plate. By means of waveguides such as those shown in FIGS. 11–20, the possibility is simultaneously created of making support 36 and the support of the diode array in the form of a single substrate carrier, which can, if desired, be structured as illustrated in the area of the waveguides.

Figure 22:
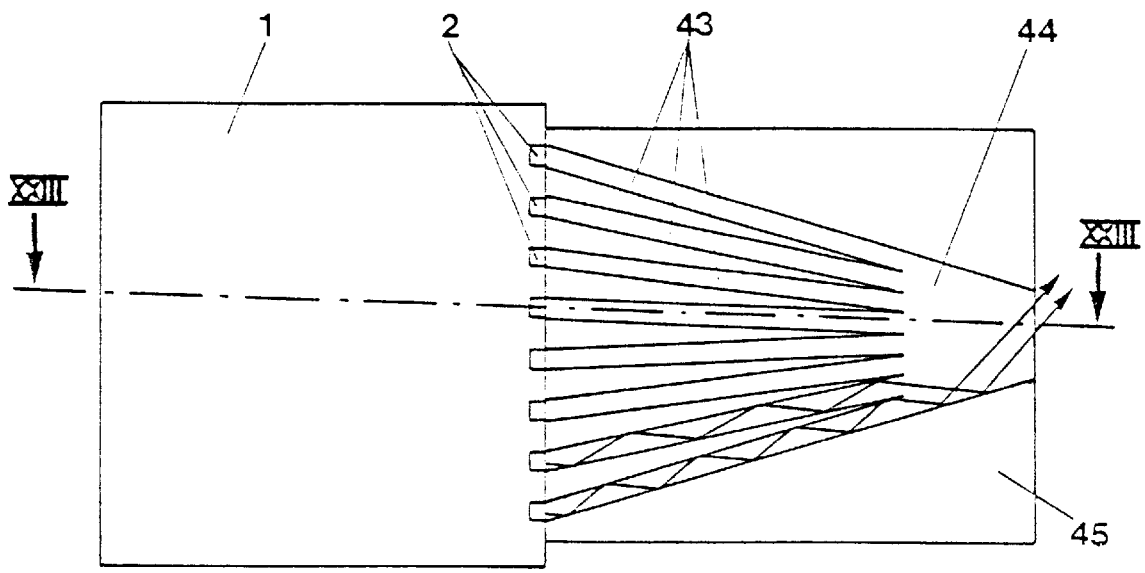
FIG. 22 shows a fifth embodiment of the invention for shaping and guiding the beams from a rectilinear laser diode array.
Figure 23:
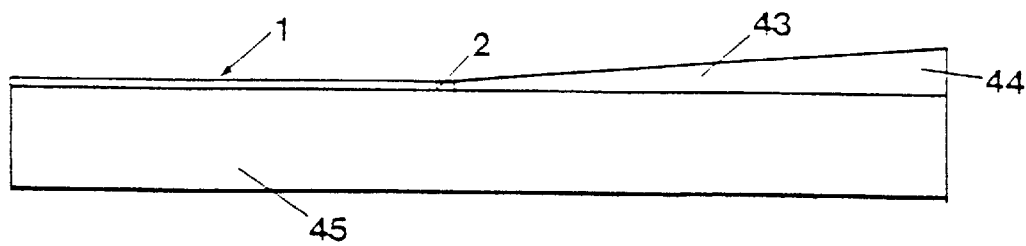
FIG. 23 shows a cross section along line XXIII—XXIII of FIG. 22.

A fifth embodiment, as illustrated in FIGS. 22 and 23, shows a laser diode array 1 with individual laser diodes 2, the radiation of which enters a waveguide 43, which has a wedge angle in the direction of the beam as previously described. The individual waveguides 43, each of which is assigned to a laser diode 2, angle toward each other, when seen from above, so that the distance between them decreases continuously. Seen in the direction of beam travel, individual waveguides 43 join at the end where the individual waveguides 43 touch to form a plate-like waveguide 44; the angle of the plate-like waveguide to support 45 continues in correspondence with the wedge angle of the individual waveguides 43, as can be seen in FIG. 23. FIG. 22 shows an individual radiation beam in each of the two lower waveguides 43. In this arrangement, the lateral surfaces of the waveguides form first, second, or additional reflecting surfaces in each case, which are offset with respect to each other. An arrangement such as this is advantageous in the sense that the entire waveguide structure is situated in one plane and thus a flat support plate 45 can be used; in addition, the possibility is created of building the substrate carriers of both laser diode array 1 and support plate 45 as a single carrier, made of silicon, for example, as a result of which an extremely stable and compact arrangement is obtained, the advantages of which are too obvious to mention.

A sixth embodiment is shown in FIGS. 24–26. In FIG. 24, the radiation from the individual diodes of a laser diode array 1, which again are arranged in a straight line on a common plane, enters a first lateral surface 46 of a square prismatic disk 47 at an angle of incidence of approximately 45°. This prismatic disk is designed as a thin plate of uniform thickness, as shown in FIG. 25. Each of the beams which enters prismatic disk 47 is reflected by individual side surfaces 46. As can be derived from the course of the individual beams after they have entered prismatic disk 47, the beam closest to lateral surface 46 is reflected from the lateral surface opposite lateral surface 46 through which it entered; it is reflected again from the adjacent lateral surface, then reflected by the next adjacent side surface, etc., until it, after one revolution, it is guided out through a lateral surface 46, onto which a beam outlet prism 48 is cemented. The beam following the beam closest to the lateral surface passes travels around side surfaces 46 an additional time until it meets the beam of the first diode. This beam, too, then escapes through prismatic exit window 48. As can be seen from the paths of the individual beams, the radiation of each succeeding diode is reflected one more time around prismatic disk 47 than the radiation of the diode preceding it. Each component beam therefore keeps being reflected until it finally arrives at the point where the prismatic exit window 48 has been cemented in place.

FIG. 26 shows an alternative geometry for prismatic disk 47 of FIG. 24. Prismatic disk 49 of FIG. 26, when seen from the top, has a diamond shape, with parallel opposing side surfaces 48.

Figure 29:
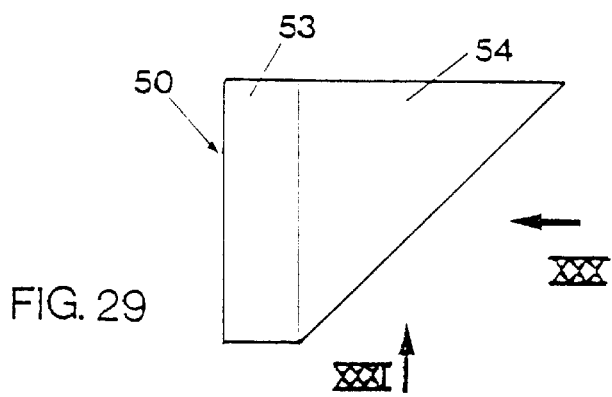
FIG. 29 shows an alternative embodiment of the waveguide part of FIG. 27.
Figure 30:
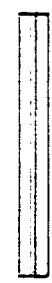
FIG. 30 shows a view of the arrangement of FIG. 29 from the direction of viewing arrow XXX of FIG. 29.

In the arrangements according to FIGS. 25 and 26, the beams of laser diode array 1 can be supplied to lateral entry surface 46 in each case by a waveguide 50, as shown in FIGS. 29 and 30 and as described further below. In addition, it is preferred that the laser diodes and all the waveguide components be arranged on a common substrate so as to achieve a compact, simple, and dimensionally stable structure.

Figure 27:
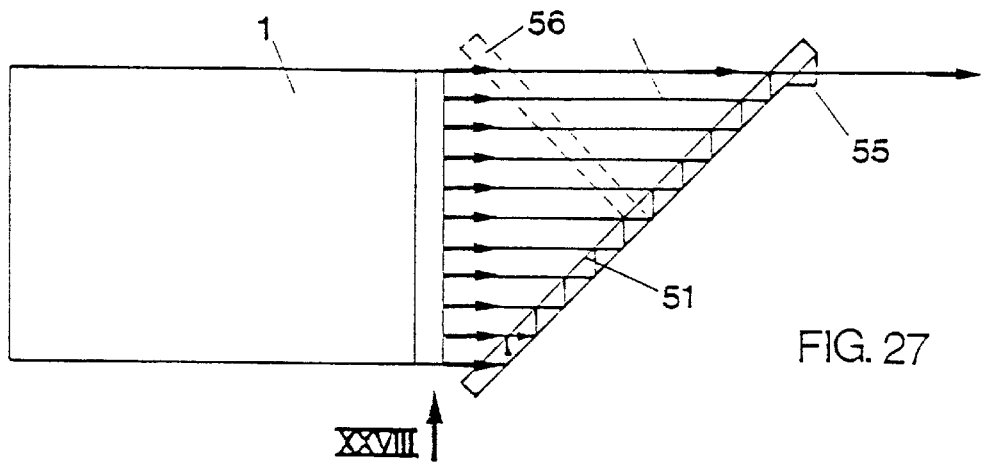
FIG. 27 shows a sixth embodiment of the invention for shaping and guiding the beams from a rectilinear laser diode array.
Figure 28:
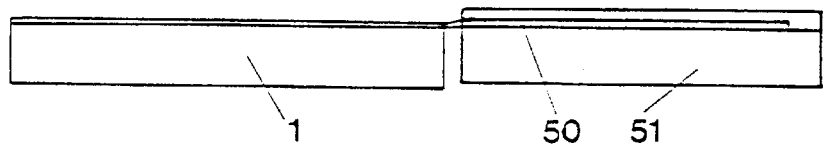
FIG. 28 shows a top view of the arrangement of FIG. 27 from the direction of viewing arrow XXIII in FIG. 27.
Figure 31:
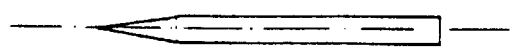
FIG. 31 shows a view of the arrangement of FIG. 29 in the direction of viewing arrow XXXI of FIG. 29.

FIGS. 27 and 28 show a seventh embodiment of the invention. In this example, an optical system with a waveguide 50 with a triangular base is assigned to laser diode array 1. Because of the triangular form of waveguide 50, its beam exit side 51 is closer to the laser diode array at one end than it is at the other, which means that the same offset is present from laser diode to laser diode or from beam to beam. A glass rod 52 is cemented in front of beam exit surface 51. Waveguide 50 can be designed similarly to the waveguides shown in FIGS. 29–31; it is subdivided into two segments 53, 54. Segment 53 on the narrow side, where the laser diode beams enter, has a wedge angle, which serves to reduce the divergence in the fast direction, as also in the case of the previously described embodiments. Second segment 54, in the form of a triangle, has no such wedge angle. Glass rod 52, shown in FIG. 27, has a rectangular cross section. The angled course of beam exit side 51 of triangular waveguide 50 with respect to the plane of beam exit surface of the laser diodes of array 1 is fixed so that the radiation of array 1 can be beamed into glass rod 52 and simultaneously conducted within glass rod 52 by total reflection from the inside surfaces, which form the reflecting surfaces. The radiation emerges from the glass rod at the point at which a small, triangular prism 55 has been cemented and the total reflection is interrupted. Alternatively, waveguide 50 can have two slanted surfaces, and the glass rod can be divided in two, as suggested by broken lines 56, so that the individual beams entering glass rod 51 are guided from the two outer sides of the arrangement toward the middle and emerge through an exit prism cemented in this case in the center. One-piece waveguide 50 can also be designed as individual waveguide rods (not shown), corresponding to the earlier embodiments. Finally, it is also possible for the radiation from the laser diode array to be beamed directly into the glass rods, but the use of a waveguide 50 is preferred. In place of glass rod 50, it is also possible to use a hollow waveguide consisting of four mirrored surfaces. One of these surfaces will then have a linear aperture, through which the radiation is beamed into the cavity. The radiation is conducted by multiple reflection through the hollow waveguide to an exit opening.

Figure 32:
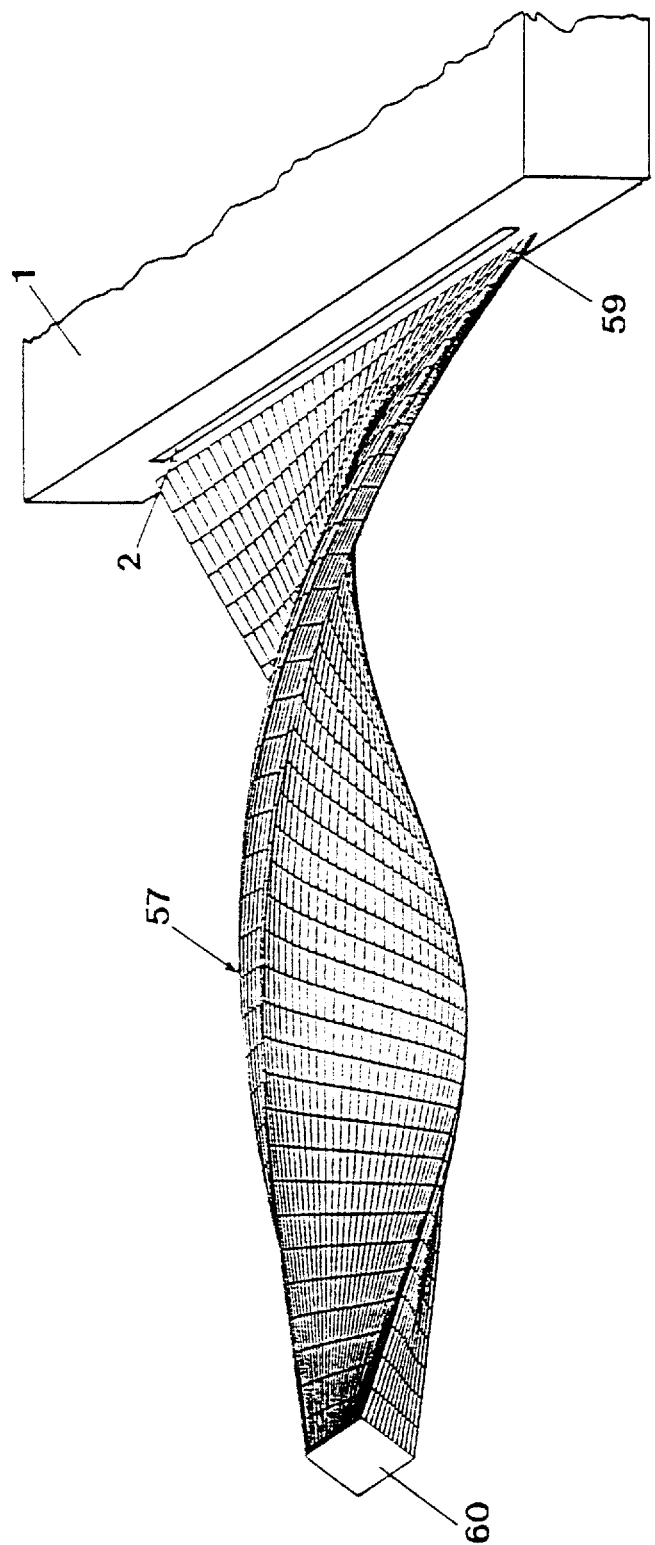
FIG. 32 shows a seventh embodiment of the invention of a waveguide with a twist.

An eighth embodiment of the invention for shaping and guiding the beams from a laser diode array 1 is shown in FIG. 32. This design involves a waveguide plate 57, which, seen in the beam direction, indicated by arrow 58, has a wedge angle such that the waveguide plate opens out in the direction of beam travel, in line with the major axis of the beam cross section of the individual laser diodes 2, from a small beam entry surface 59 to a beam exit surface 60. In addition, the width, that is, the extent of waveguide plate 57 in the direction in which laser diodes 2 are arranged, also decreases, as can be seen in the figure. Furthermore, this waveguide plate 57 has a twist in beam direction 58 such that plate 57 rotates as it proceeds toward beam exit side 60. The individual dividing lines in this diagram serve to clarify the illustration of waveguide plate 57, but they can also be considered individual reflecting surfaces for the radiation. Within this twisted, plate-like waveguide body 57, the beams are totally reflected and compressed in both beam directions, that is, both in the fast and in the slow direction, until the beamed-in radiation ultimately emerges through beam exit window 60. This embodiment offers the particular advantage that all the diode beams are combined into a single beam.

It is claimed:

1. Arrangement for shaping and guiding the beams from a rectilinear laser diode array with beam exit surfaces lying on a common plane by means of a system of reflecting optical elements, characterized in that to gather the individual exit beams (14), at least one first reflecting element (18, 35; 43, 44; 47; 49; 50; 52; 57) with a reflecting surface (17; 40; 46) is assigned to each beam (15), and in that the reflecting surfaces are arranged on planes which are offset with respect to each other, the sequence of offsets corresponding to the sequence of the laser diodes (2) of the array (1).

2. Arrangement according to claim 1, characterized in that a strip-like or ribbon-like waveguide (35) with a wedge angle opening in the beam direction is assigned to the beam of each laser diode (2), the beam entering one end of the waveguide, whereas the first reflecting surface (40) assigned to the beam, configured as a beveled surface which reflects the beam sideways, is located at the other end (40).

3. Arrangement according to claim 2, characterized in that the waveguide has two flat boundary surfaces, which form an angle with each other from the beam entry side to the beam exit side and which are perpendicular to a common plane.

4. Arrangement according to claim 3, characterized in that the angle is in the range of 5°–15°, and in that the length of the waveguide is in the range of 2–10 mm.

5. Arrangement according to claim 2, characterized in that the second reflecting surfaces are formed by a second mirror configured in the form of a staircase.

6. Arrangement according to claim 2, characterized in that the waveguide or waveguides (35; 47; 49; 27; 43; 44) and the laser diodes (2) of the array (1) are arranged on a common substrate (45).

7. Arrangement according to claim 6, characterized in that the substrate (45) is made of silicon.

8. Arrangement according to claim 1, characterized in that at least one additional, second reflecting surface (24) is assigned to each first reflecting surface (17), and in that these second reflecting surfaces (24) are located on planes which are offset with respect to each other and are at different distances from the first reflecting surfaces (17) assigned to them, the sequence of offsets and the sequence of the changes in the distance between the second reflecting surfaces (24) and the first reflecting surfaces corresponding to the sequence of the first reflecting surfaces (17).

9. Arrangement according to claim 8, characterized in that third to n-th reflecting surfaces are assigned to each second reflecting surface (24), and in that the n-th reflecting surfaces are located on planes which are offset with respect to each other and are at different distances from the (n−1)th reflecting surfaces assigned to them, the sequences of the offsets and of the changes in the distance between the sets of reflecting surfaces corresponding to the sequences of the (n−1)th reflecting surfaces.

10. Arrangement according to claim 9, characterized in that n−3 or 4.

11. Arrangement according to claim 8, characterized in that the first and second reflecting surfaces (17; 24) are oriented in such a way that, after the first reflecting surface (17), the individual beams (19) of the diodes are offset with respect to each other in a staircase-like manner on an image plane (20), and in that, after the second reflecting surface (24), they are above and below each other on an image plane (25) in such a way that they form a continuous radiation field.

12. Arrangement according to claim 1, characterized in that a common plate-like waveguide (50) with a wedge angle which opens in the beam direction is assigned to the beam of each laser diode, the beam entering one end of the waveguide and exiting at the other end, where the distance between this beam exit end surface and the laser diode array increases continuously from the first laser diode to the last laser diode or from the two outermost diodes to a central diode, and where a glass rod with a rectangular cross section is placed directly on the beam exit end surface, the rod surface adjacent to the beam exit surface and the opposite rod surface being made reflective, and where the beams, after total reflection, emerge through a beam exit window (55) in the area of the glass rod (51) farthest away from the laser diodes.

13. Arrangement according to claim 12, characterized in that the plate-like waveguide has two flat boundary surfaces, which form an angle with each other from the beam entry side to the beam exit side and which are perpendicular to a common plane.

14. Arrangement according to claim 13, characterized in that the angle is in the range of 5°–15°, and in that the length of the waveguide is in the range of 5–20 mm.

15. Arrangement according to one of claims 12–14, characterized in that the second reflecting surfaces are formed by a second mirror, configured in the form of a staircase.

16. Arrangement according to claim 1, characterized in that the first reflecting surfaces (17) are formed by a first mirror (18), configured in the form of a staircase.

17. Arrangement according to claim 16, characterized in that the reflecting surfaces (17) are flat surface areas.

18. Arrangement according to claim 1, characterized in that the second reflecting surfaces (24) are formed by a second mirror (21), configured in the form of a staircase.

19. Arrangement according to claim 18, characterized in that the reflecting surfaces (24) are flat surface areas.

20. Arrangement according to one of claim 1, characterized in that a common plate-like waveguide (47; 49) with four end surfaces (46) is assigned to the beams of each laser diode, the end surfaces forming two pairs, the surfaces of each pair being parallel to each other; in that the beams enter one end surface (46), whereas the other end surfaces reflect the beams; in that the beam entry surface forms an acute angle with the plane of the beam exit surface of the laser diodes; and in that the beams are reflected in such a way that the beams of the individual diodes are combined and then escape through a beam exit window (48).

21. Arrangement according to claim 20, characterized in that each of the end surfaces (46) forms an angle of 90° to the end surfaces adjacent to it.

22. Arrangement according to one of claim 1, characterized in that a common plate-like waveguide (57) with a wedge angle which opens in the beam direction perpendicular to the line along with the laser diodes extend is assigned to the beams of each laser diode, the beams entering one end surface (59) of the waveguide and emerging from the opposite end surface (60), and has with a wedge angle which narrows down in the beam direction parallel to the line along which the laser diodes extend, where the plate-like waveguide is twisted around its longitudinal axis extending in the beam direction.

23. Arrangement according to claim 22, characterized in that the twist angle is 180°.

24. Arrangement according to claim 1, characterized in that an optical imaging system (16) is provided between the beam exit surface and the first reflecting element.

25. Arrangement according to claim 24, characterized in that the optical imaging system (16) consists of a strip-like or ribbon-like waveguide (27) with a wedge angle opening in the beam direction, the beam entering one end surface (31) of the waveguide and emerging from the opposite end surface (32) adjacent to the first reflecting surface.

26. Arrangement according to one of claim 1, characterized in that a strip-like or ribbon-like waveguide (43) with a wedge angle opening in the beam direction is assigned to the beam of each laser diode, where, looking in the beam direction, these waveguides (43) come together to form a common, plate-like waveguide (44), and where the beams emerge from the free, opposite surface of the plate-like waveguide (44).

27. Arrangement according to claim 26, characterized in that the waveguide (43, 44) has a wedge angle opening in the beam direction.

28. Arrangement according to claim 1, characterized in that the reflecting surfaces (17) are each a different distance away from the beam exit surfaces (4) assigned to them, and in that the sequence of different distances corresponds to the sequence of the laser diodes (2) of the array (1).

29. Arrangement according to claim 1, characterized in that the centers of the irradiated surface areas of the individual first reflecting surfaces (17) are located on a straight line.

30. Arrangement according to one of claim 1, characterized in that the offsets between adjacent first reflecting surfaces (17) are all of the same size, and in that the changes in the distance between these surfaces and the laser diode array are also all the same.

31. Arrangement for shaping the geometric cross section of a rectilinear laser diode array extending in the x direction by means of an optical system, where the beam exit surfaces of the laser diodes are located on a common plane extending in the xy direction and the emerging beams radiate essentially in the z direction, to generate a defined cross section of a radiation field, where the optical system has reflective elements, each of which is offset with respect to the others in the z direction, toward which elements the radiation components of the laser diodes are directed at an angle of incidence, where the x, y, and z directions determine a Cartesian coordinate system, characterized in that, to reorient the individual exiting beams, a first reflective element with its reflecting surface is assigned to each beam, the reflecting surfaces being located on planes which are offset and/or tipped with respect to each other in such a way that each of the radiation components reflected from the reflecting surfaces are offset with respect to each other perpendicular to the propagation or z direction in comparison with the orientation of beam exit surfaces and also in the y direction with respect to the direction in which the laser diode array extends, where the sequence of these first offsets corresponds to the sequence of laser diodes of the array.

32. Arrangement according to one of claim 31, wherein a strip-like or ribbon-like waveguide with a wedge angle opening in the beam direction is assigned to the beam of each laser diode, the beam entering one end of this waveguide, whereas the first reflecting surface assigned to each beam is at the opposite end, each of these end surfaces being beveled to reflect the beam sideways.

33. Arrangement according to claim 32, wherein the waveguide has two flat boundary surfaces, which form an angle with each other from the beam entry side to the beam exit side and which are perpendicular to a common plane.

34. Arrangement according to claim 33, wherein the second reflecting surfaces are formed by a mirror configured in the form of a staircase.

35. Arrangement according to claim 32, wherein the waveguide or waveguides and the laser diodes of the array are arranged on a common substrate.

36. Arrangement according to claim 35, wherein the substrate is made of silicon.

37. Arrangement according to one of claim 32, wherein the reflecting surfaces are formed by a mirror configured in the form of a staircase.

38. Arrangement according to claim 31 wherein at least one additional second reflecting surface is assigned to each first reflecting surface wherein this second reflecting surface is arranged on planes which are offset and/or tipped with respect to each other and are different distances away from the first reflecting surface assigned to them, where the sequence of the offsets and of the changes in distances of reflecting surfaces correspond to the sequence of the first reflecting surface in such a way that the radiation components from the first reflecting surface are reflected with an offset essentially perpendicular to the first offset.

39. Arrangement according to claim 38, wherein third to n-th reflecting surfaces are assigned to each second reflecting surface and wherein the n-th reflecting surfaces are located on planes which are offset with respect to each other and are different distances away from the (n−1) th reflecting surfaces assigned to them, where the sequence of offsets and of changes in distance of the reflecting surfaces corresponds to the sequence of the (n−1)th reflecting surfaces.

40. Arrangement according to claim 39, wherein n=3 or 4.

41. Arrangement according to claim 38, wherein the reflecting surfaces are flat surface areas.

42. Arrangement according to claim 38, wherein the first and second reflecting surfaces are aligned in such a way that, after the individual beams of the diodes have passed the first reflecting surfaces, they are offset with respect to each other on an image plane in a staircase-like manner, and wherein, after the second reflecting surface, they are above and below each other on an image plane in such a way that they form a continuous radiation field.

43. Arrangement according to claim 31, wherein a common plate-like waveguide with a wedge angle opening in the beam direction perpendicular to the line in which the laser diode array extends is assigned to the beams of each laser diode, the beams entering one end surface of the waveguide and exiting at an opposite end, and has with a wedge angle which narrows down in the beam direction, parallel to the line in which the laser diodes extend, where the plate-like waveguide has a twist around its longitudinal axis extending in the beam direction.

44. Arrangement according to claim 43, wherein the twist angle is 180°.

45. Arrangement according to claim 43, wherein an optical imaging system is inserted between the beam exit surface and the first reflective element.

46. Arrangement according to claim 45, wherein the optical imaging system consists of a strip-like or ribbon-like waveguide with a wedge angle which opens in the beam direction, the beam entering one end surface of the waveguide and emerging through an opposite end surface, adjacent to the first reflecting surface.

47. Arrangement according to claim 31 wherein the first reflecting surface is formed by a first mirror, configured in the form of a staircase.

48. Arrangement according to claim 47, wherein the reflecting surfaces are flat surface areas.

49. Arrangement according to claim 48, wherein the second reflecting surfaces are formed by a second mirror, configured in the form of a staircase.

50. Arrangement according to claim 31, wherein the reflecting surfaces are different distances away from the beam exit surfaces assigned to them, and wherein the sequence of the changes in these distances corresponds to the sequence of laser diodes of the array.

51. Arrangement according to claim 31 wherein the centers of the irradiated surface areas of the individual first reflecting surfaces are on a straight line.

52. Arrangement according to one of claim 31 wherein the offsets between adjacent first reflecting surfaces are all of the same size, and in wherein of the changes in distance are the same.

* * * * *

UNITED STATES PATENT AND TRADEMARK OFFICE
CERTIFICATE OF CORRECTION

PATENT NO. : 5,887,096
DATED : March 23, 1999
INVENTOR(S) : Keming DU et al.

It is certified that error appears in the above-identified patent and that said Letters Patent is hereby corrected as shown below:

On the <u>cover</u>, in the section entitled <u>Abstract</u>, <u>line 3</u>, after "disclosed" insert -- . --.

In <u>column 3</u>, <u>line 1</u>, change the second occurrence of "on" to -- of --.

In <u>Claim 10</u>, <u>column 12</u>, <u>line 2</u>, change "n - 3" to -- n = 3 --.

In <u>Claim 22</u>, <u>column 12</u>, <u>line 66</u>, change "with" to -- which --.

Signed and Sealed this

Eleventh Day of January, 2000

Attest:

Q. TODD DICKINSON

*Attesting Officer*  Acting Commissioner of Patents and Trademarks